United States Patent
Virkler et al.

(10) Patent No.: US 10,867,504 B2
(45) Date of Patent: Dec. 15, 2020

(54) MONITORING OF MARSHALLING CABINET WIRING

(71) Applicant: Baker Hughes Oilfield Operations LLC, Houston, TX (US)

(72) Inventors: Adam Eric Virkler, Houston, TX (US); Shohei Hara, Houston, TX (US); Steven Jackson Foss, Houston, TX (US); Timothy Paul Wallace, Houston, TX (US); Reginald Nicoson, Houston, TX (US); Christie Shannon Burrow, New Market, MD (US); Stephen Luke Micelle, Naples, FL (US); Saleh Yousef Alloughani, Kuwait (KW); Abdulrahman Abdulaziz Alnoaim, Dhahran (SA); Gabriel Zachery Rodriguez, Highlands Ranch, CO (US)

(73) Assignee: BAKER HUGHES OILFIELD OPERATIONS LLC, Houston, TX (US)

(*) Notice: Subject to any disclaimer, the term of this patent is extended or adjusted under 35 U.S.C. 154(b) by 0 days.

(21) Appl. No.: 16/855,310

(22) Filed: Apr. 22, 2020

(65) Prior Publication Data
US 2020/0342739 A1  Oct. 29, 2020

Related U.S. Application Data

(60) Provisional application No. 62/838,918, filed on Apr. 25, 2019.

(51) Int. Cl.
*G08B 21/18* (2006.01)
*H01B 7/00* (2006.01)
(Continued)

(52) U.S. Cl.
CPC .......... *G08B 21/18* (2013.01); *H01B 7/0045* (2013.01); *H01R 13/70* (2013.01); *H01R 13/717* (2013.01); *H05K 7/1469* (2013.01)

(58) Field of Classification Search
CPC ...... G08B 21/18; H01B 7/0045; H01R 13/70; H01R 13/717; H05K 7/1469
See application file for complete search history.

(56) References Cited

U.S. PATENT DOCUMENTS

| | | | | |
|---|---|---|---|---|
| 4,874,908 A | * | 10/1989 | Johansson | H02B 1/202 |
| | | | | 174/72 A |
| 6,130,386 A | * | 10/2000 | Jorczak | H01H 9/161 |
| | | | | 200/17 R |

(Continued)

FOREIGN PATENT DOCUMENTS

| | | |
|---|---|---|
| EP | 0092045 A2 | 10/1983 |
| KR | 10-2008-0072731 A | 8/2008 |
| KR | 10-2012-0031614 A | 4/2012 |

OTHER PUBLICATIONS

International Search Report and Written Opinion issued in corresponding International Application No. PCT/US2020/029491, dated Jul. 29, 2020, 9 pages.

*Primary Examiner* — Mohamed Barakat
(74) *Attorney, Agent, or Firm* — Mintz Levin Cohn Ferris Glovsky and Popeo, PC; Lisa Adams

(57) ABSTRACT

A method of monitoring connection status of wiring within a marshalling cabinet includes generating, by a switch including a first portion and a second portion, a socket connection signal when the switch is closed. The switch closes when a wire harness including the second switch portion is inserted within a socket of a terminal block including the first switch portion by a predetermined amount. The wire harness includes wire harness pins in communication with factory wiring of an industrial control (Continued)

system and the terminal block includes terminal block pins in communication with field wiring of the control system. The method also includes receiving the socket connection signal and determining a socket connection status. The status is determined to be connected when the socket connection signal is received by the processor and determined to be disconnected status absent receipt of the connection signal. The determined connection status is also output.

16 Claims, 10 Drawing Sheets

(51) Int. Cl.
*H05K 7/14* (2006.01)
*H01R 13/717* (2006.01)
*H01R 13/70* (2006.01)

(56) References Cited

U.S. PATENT DOCUMENTS

| | | | |
|---|---|---|---|
| 9,946,240 B2 | 4/2018 | Erni | |
| 10,085,520 B2* | 10/2018 | Moran | A44B 11/2519 |
| 2005/0063647 A1* | 3/2005 | Thornton | G02B 6/421 |
| | | | 385/89 |
| 2012/0028488 A1* | 2/2012 | Puschnigg | G06F 1/3203 |
| | | | 439/189 |
| 2015/0016084 A1* | 1/2015 | Hrncir, Jr. | H01H 71/46 |
| | | | 361/824 |
| 2015/0127876 A1 | 5/2015 | Erni et al. | |
| 2018/0254030 A1* | 9/2018 | Mayo | G10H 1/0091 |
| 2019/0052025 A1* | 2/2019 | Buechli | H01R 13/7175 |

\* cited by examiner

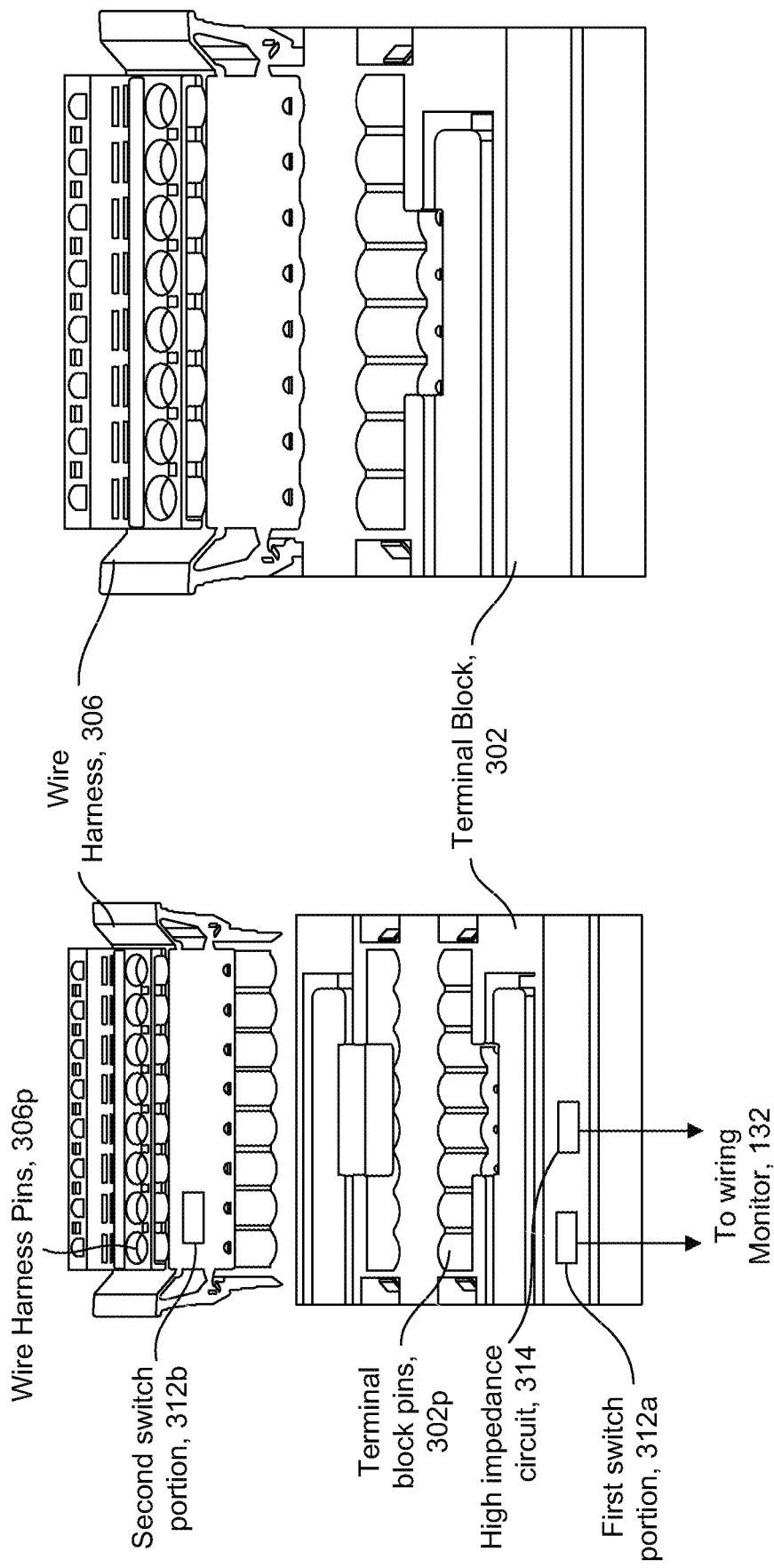

MONITORING OF MARSHALLING CABINET WIRING

CROSS-REFERENCE TO RELATED APPLICATIONS

This application claims the benefit of U.S. Provisional Patent Application No. 62/838,918, filed Apr. 25, 2019 and entitled "Monitoring of Marshalling Cabinet Wiring," the entirety of which is incorporated by reference.

BACKGROUND

Industrial control systems can be employed for control of machines in industrial environments to perform desired processes. Examples of such industrial environments can include power generation and distribution, oil and gas production and supply, and food production, amongst others. In general, an industrial control system can be configured to provide commands to actuators establishing set points for process variables. Actual values of the process values can be monitored using sensors and the set points can be updated by the industrial control system based upon the measured process values to adjust the process variables and achieve the predetermined set points.

Signals conveying information such as sensor measurements and computing device commands can be transmitted via wires. Marshalling cabinets can be deployed at one or more predetermined locations within an industrial environment and configured to receive terminal ends of field wiring extending from field devices (e.g., actuators, sensors) and factory wiring extending from the industrial control system. The marshalling cabinets can be further configured to interconnect the field wiring and the factory wiring via input/output (I/O) cards. In this manner, maintenance and operation of field wiring and factory wiring can be performed at the marshalling cabinet.

However, the process of wiring a marshalling cabinet can be tedious and prone to human error. With additional wiring, maintaining visibility of electrical components within the marshalling cabinet can become more difficult. Furthermore, electrical components can become more difficult to reach. Furthermore, marshalling cabinets can be variable in size across different installations, which can limit the available space for cabinet components. This can result in extensive time and labor costs.

DESCRIPTION OF DRAWINGS

These and other features will be more readily understood from the following detailed description taken in conjunction with the accompanying drawings, in which:

FIG. 4A is a diagram illustrating an isometric view of a wiring harness, terminal blocks, and respective pins of the wiring connector of FIGS. 2A-2B prior to coupling;

FIG. 4B is a diagram illustrating an isometric view of the wiring harness and terminal blocks of the wiring connector of FIGS. 2A-2B after coupling;

Figure 1:
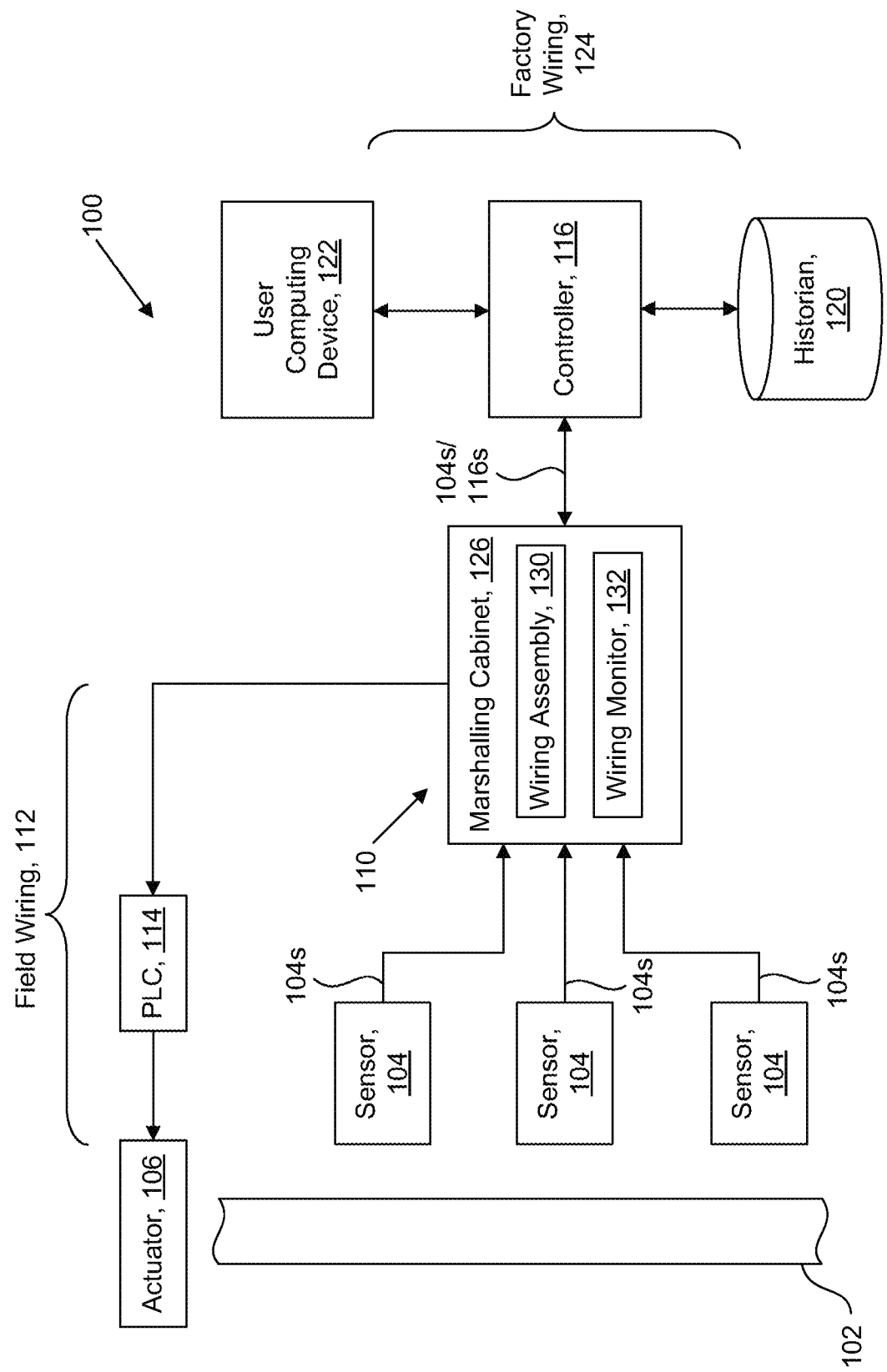
FIG. 1 is a block diagram illustrating one exemplary embodiment of an operating environment including an industrial control system and marshalling system.

It is noted that the drawings are not necessarily to scale. The drawings are intended to depict only typical aspects of the subject matter disclosed herein, and therefore should not be considered as limiting the scope of the disclosure.

SUMMARY

In an embodiment, a marshalling system is provided and it can include a wiring assembly and at least one processor. The wiring assembly can include at least one wiring connector mounted to a base. Each wiring connector can be in electrical communication with a power supply and includes a terminal block, a wire harness, and a switch. The terminal block can include a socket and one or more terminal block pins configured for electrical communication with field wiring of an industrial control system. The wire harness can be dimensioned for receipt within the socket and it can further include one or more wire harness pins configured for electrical communication with factory wiring of the industrial control system. The switch can include a first portion positioned within the terminal block and a second portion positioned within the wire harness. The switch can be configured to close when the wire harness is inserted with the socket by a predetermined amount. The switch can be further configured to output a socket connection signal when closed. The socket connection signal can represent that the socket has a connected status. The at least one processor can be configured to receive the socket connection signal. The at least one processor can be further configured to determine a connection status for the socket. The at least one processor can determine that the socket has the connected status when receiving the socket connection signal. The at least one processor can determine that socket has a disconnected status absent receipt of the connection signal. The at least one processor can be additionally configured to output the determined socket connection status.

In another embodiment, the system can further include a high-impedance circuit in electrical communication with a terminal block pin of the socket, the power supply, and the at least one processor. Each high-impedance circuit can be configured to output a pin connection signal at a predetermined level to the at least one processor when the terminal block pin is in electrical communication with a corresponding wire harness pin.

In another embodiment, the at least one processor can be configured to determine a pin connection status of the terminal block pin with the corresponding wire harness pin. The at least one processor can determine the pin connection status to be a connected status when the at least one processor receives the pin connection signal. The at least one processor can determine the pin connection status to be a disconnected status absent receipt of the pin connection signal by the at least one processor. The at least one processor can also be configured to output the determined pin connection status.

In another embodiment, the at least one processor can be further configured to trigger an alarm when the socket connection status changes from the connected status to the disconnected status.

In another embodiment, the switch can be a magnetic switch, the first portion of the magnetic switch can be a reed switch, and the second portion of the magnetic switch can be a magnetic actuator.

In another embodiment, the switch can be further configured to open when the wire harness is not inserted within its corresponding socket by the predetermined amount and to output a socket disconnection signal when open. The at least one processor can be further configured to receive the disconnection signal and to determine that a socket has the disconnected status by receipt of the socket disconnection signal for that wiring connection.

In another embodiment, the wiring assembly can further include a light configured to adopt a first illumination state when the connection status of the socket is determined to be the connected status and adopt a second illumination state, different from the first illumination state, when the connection status of the socket is not the connected status.

In an embodiment, a method is provided. The method can include generating, by a switch including a first portion and a second portion, a socket connection signal when the switch is closed. The switch can be configured to close when a wire harness including the second switch portion is inserted within a socket of a terminal block including the first switch portion by a predetermined amount. The wire harness can include more wire harness pins in communication with factory wiring of an industrial control system and the terminal block can include one or more terminal block pins in communication with field wiring of the industrial control system. The method can also include receiving, by one or more processors, the socket connection signal. The method can further include determining, by the one or more processors, a connection status for the socket. The socket can be determined to have a connected status when the socket connection signal is received by the one or more processors. The socket can be determined to have a disconnected status absent receipt of the connection signal by the one or more processors. The method can additionally include outputting, by the one or more processors, the determined socket connection status.

In another embodiment, the method can further include triggering, by the one or more processors, an alarm when the socket connection status changes from the connected status to the disconnected status.

In another embodiment, the method can further include outputting, by a high impedance circuit in communication with a terminal block pin, a pin connection signal when the terminal block pin is in electrical communication with a corresponding wire harness pin. The method can also include determining, by the at least one processor, a pin connection status of the terminal block pin with the corresponding wire harness pin. The at least one processor can determine that the pin connection status is a connected status when the at least one processor receives the pin connection signal. The at least one processor can determine that the pin connection status is a disconnected status absent receipt of the pin connection signal by the at least one processor. The method can additionally include outputting, by the at least one processor, the determined pin connection status In another embodiment, the method can also include triggering, by the one or more processors, an alarm when the pin connection status changes from the connected status to the disconnected status.

In another embodiment, the switch can be further configured to open when the wire harness is not inserted within its corresponding socket by the predetermined amount. The method can also include outputting, by the switch, a socket disconnection signal when open. The method can additionally include receiving, by the at least one processor, the socket disconnection signal. the method can further include determining, by the at least one processors, that the socket status connection is a disconnected status when the socket disconnection signal is received by the at least one processor.

In another embodiment, the method can include adopting, by a light coupled to the terminal block, a first illumination state after the connection status of the socket is determined to be the connected status. The method can further include adopting, by the light, a second illumination state, different from the first illumination state, when the connection status of the socket is not the connected status.

In another embodiment, the method can further include generating, by the one or more processors, a graphical user interface including at least one visual indicator representing the determined socket connection status or the determined pin connection status.

In another embodiment, the graphical user interface can further include a representation of least one of the terminal blocks or terminal block pins arranged in a layout corresponding to a physical layout of the plurality of terminal blocks or terminal block pin. The at least one visual indicator can be associated with its corresponding terminal block or terminal pin. As an example, the at least one visual indicator can be overlaid or positioned adjacent to its corresponding terminal block or terminal pin.

In another embodiment, the graphical user interface can further include a first user interface object. The first user interface object can be operative to, when selected within the graphical user interface, disable determination of the connection status for at least one of a selected socket or a selected terminal block pin by the at least one processor.

DETAILED DESCRIPTION

Industrial control systems can utilize wiring to transmit electrical signals to and from monitoring and control equipment in the field. Other analysis and control systems can be connected to field equipment at marshalling cabinets. However, marshalling cabinets can contain a large number of wires and it can be challenging to identify wires that are not connected properly. Accordingly, systems and corresponding methods are provided for monitoring wiring connections within marshalling cabinets. Wiring assemblies are provided that include wiring connectors having sockets configured to connect to sensors and actuators in the field via field wiring. Wire harnesses are provided that are configured to connect to remote control systems via factory wiring. Wiring monitors are provided that detect and record a connection status of the wire harnesses. The connection status information can be presented in a graphical user interface for display to an operator. The graphical user interface can further allow a user to select a time period of connection status information to display (e.g., current time, specific times or time windows, etc.). Alarms can also be annunciated based upon detection of one or more predetermined connection statuses.

Embodiment of the disclosure present systems and methods for monitoring wiring connections in the context of marshalling cabinets. However, it can be understood that in alternative embodiments, the disclosed systems and methods can be employed for monitoring any wiring connections, such as those within a control cabinet.

FIG. 1 illustrates one exemplary embodiment of an operating environment including an industrial control system 100 configured to operate and monitor an industrial process performed using a target 102. The industrial control system 100 can include one or more sensors 104 and one or more actuators 106 in signal communication with a marshalling system 110 via field wiring 112.

The sensors 104 and actuators 106 form part of a feedback control system configured to control one or more process variables associated with a process performed by the target 102. The sensors 104 can be configured to measure the one or more process variables and output sensor signals 104s representing the measured process variables. In general, the sensors 104, actuators 106, and process variables can adopt any form suitable for the process performed by the target 102. As an example, assuming the target 102 is a rotating shaft configured to drive a load, process variables could include one or more of rotation speed, vibration amplitude, runout, temperature, sound level, etc. Suitable sensors 104 can include proximity sensors, rotary encoders, thermocouples, and the like.

The sensor signals 104s can be transmitted to the marshalling system 110, and directed to programmable logic controllers (PLCs) 114 via the field wiring 112. Each PLC 114 can compare a received process variable to one or more predetermined set points and issue commands to an associated actuator 106. The actuator 106 can actuate in response to received commands and adjust the process variable. In this manner, process variables of the target 102 can be monitored and controlled to achieve the predetermined set points.

The industrial control system 100 can further include a controller 116 in signal communication with the marshalling system 110, a historian 120, and a user computing device 122, via factory wiring 124. The controller 116 can be a computing device including one or more processors configured to receive the predetermined set points and transmit command signals 116s including the predetermined set points to the marshalling system 110 for direction to the PLCs 114. In one aspect, the predetermined set points can be based upon input received from user input via the user computing device 122. In another aspect, the predetermined set points can be based upon information received from the historian 120. The controller 116 can also be configured to receive the sensor signals 104s containing process variables from the marshalling system 110 and store the process variables as a function of time in the historian 120 via the factory wiring 124.

The field wiring 112 is connected to the factory wiring 124 within a marshalling cabinet 126 of the marshalling system 110. Proper connection of the field wiring 112 to the factory wiring 124 within the marshalling cabinet 126 can ensure that sensor measurements (e.g., sensor signals 104s) and command signals are correctly routed between the field wiring and the factory wiring. As noted above, however, these connections are made by technicians and can be subject to error. As an example, a technician can fail to connect field wiring and/or factory wiring.

To alleviate this problem, embodiments of the marshalling system 110 can employ an improved wiring assembly 130, and a wiring monitor 132 enclosed within the marshalling cabinet 126. As discussed in greater detail below, the marshalling system 110 (e.g., the wiring monitor 132) can be configured to determine a connection status of field wiring 112 and factory wiring 124 that the marshalling system 110 is intended to support. The connection status can be further transmitted to the controller 116 for storage by the historian 120 as a function of time. In response to requests from an operator via the user computing device 122, the controller 116 and/or the wiring monitor 132 can receive past connection status data from the historian 120 and/or current connection status data directly from the sensors 104 and generate graphical user interfaces for display by the user computing device 122. The controller 116 and/or the wiring monitor 132 can be further configured to provide alarms when an improper state of connection is detected.

Beneficially, so configured, the marshalling system 110 can allow an operator of the industrial control system 100 to inspect the past and/or current connection status of field wiring 112 to factory wiring 124. This connection status information can facilitate rapid troubleshooting and reduced cost of installation, repair, and/or maintenance. In further benefit, the controller 116 and the wiring monitor 132 can operate asynchronously, allowing the user to control the displayed connection status information displayed within the graphical user interface via commands entered through a user computing device 122.

Figure 2A:
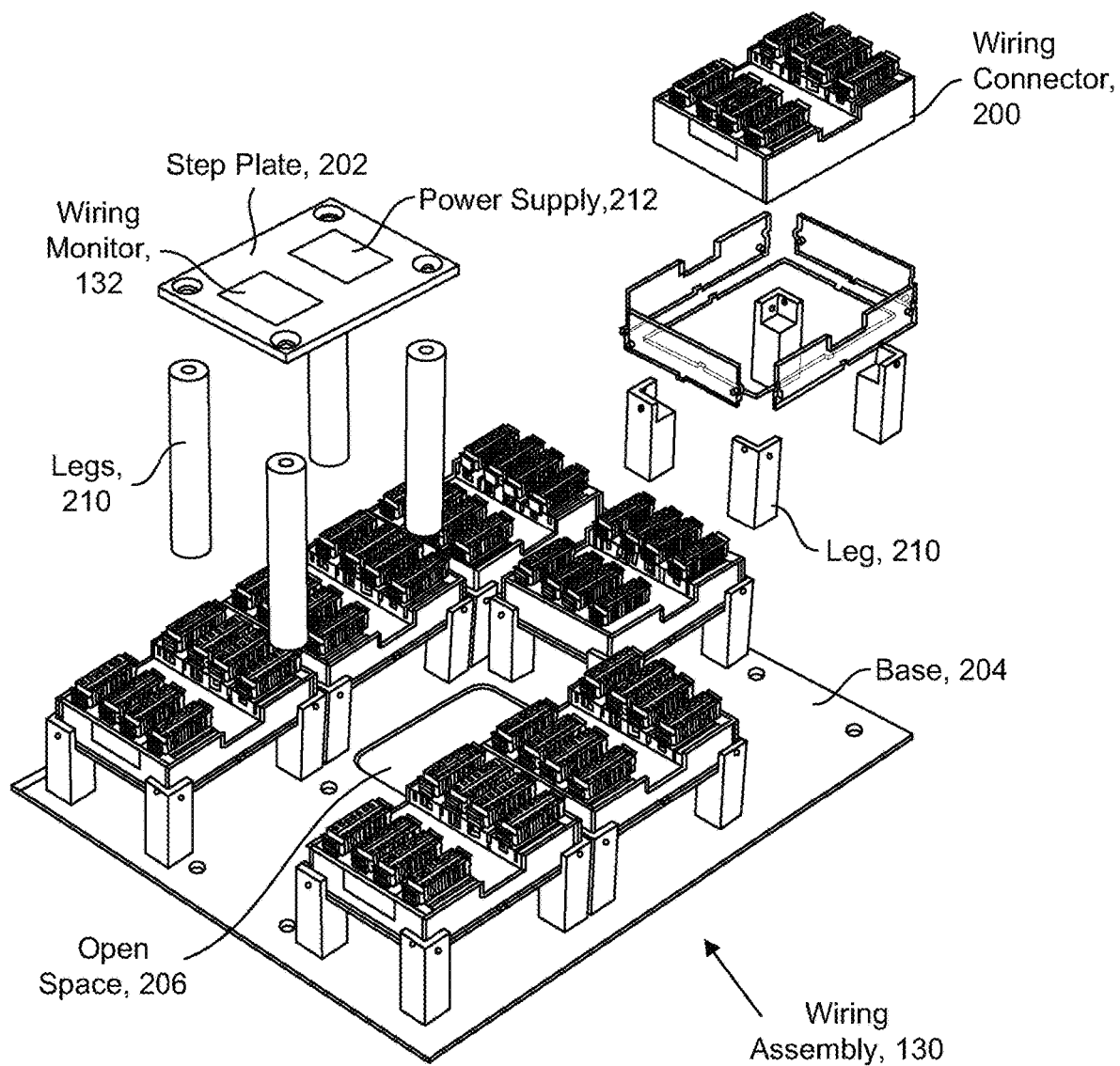
FIG. 2A is a diagram illustrating an isometric, exploded view of one exemplary embodiment of a wiring assembly of the marshalling system of FIG. 1 including wiring connectors and in communication with a wiring monitor.
Figure 2B:
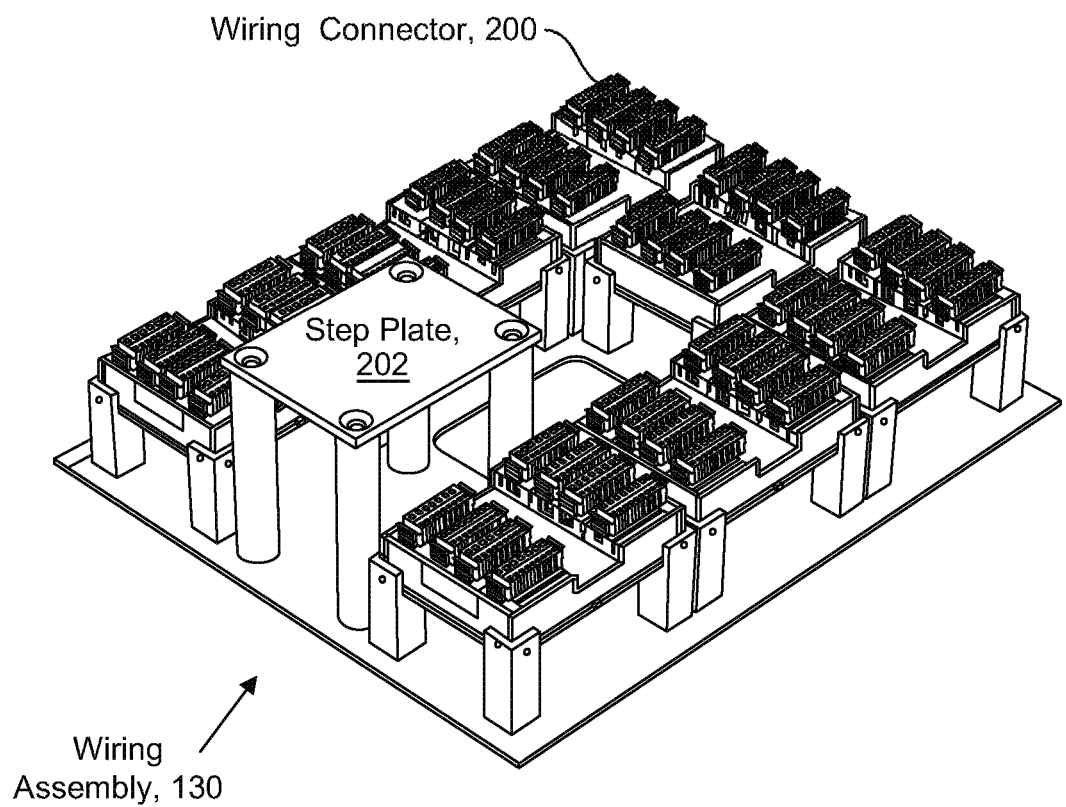
FIG. 2B is a diagram illustrating an isometric view of one exemplary embodiment of the wiring assembly of FIG. 1.

FIGS. 2A-2B illustrate one exemplary embodiment of the marshalling system 110 including the wiring assembly 130 and the wiring monitor 132. The marshalling cabinet 126 is omitted for clarity. FIG. 2A illustrates the wiring assembly 130 in an exploded view while FIG. 2B illustrates the wiring assembly 130 in an assembled view. As shown, the wiring assembly 130 includes one or more wiring connectors 200 and a step plate 202 mounted to a base 204.

The base 204 can be a generally flat plate including an open space 206 or cutout dimensioned to receive one or more wires therethrough (e.g., field wiring 112 and/or factory wiring 124). The base 204 can be mounted at a predetermined location within the marshalling cabinet 126. Examples of mounting locations within the marshalling cabinet 126 can include the bottom, the top, the sides, and combinations thereof.

The base 204 can be further dimensioned to accommodate the one or more wiring connectors 200. The wiring connectors 200 can be modular and the number of wiring connectors 200 mounted to the base 204 can be varied without limit. The step plate 202 and the wiring connector 200 can be coupled to the base 204 by respective legs 210. Use of the legs for mounting distances the step plate 202 and respective wiring connectors 200 from the base 204 to provide clearance for wiring extending beneath the step plate 202 and the wiring connector 200.

The wiring monitor 132 and a power supply 212 can be mounted to the step plate 202. The wiring monitor 132 can be one or more computing devices in communication with the wiring connectors 200 and configured to detect a connection status (e.g., connected or disconnected) of field wiring 112 to factory wiring 124 within the wiring connectors 200. In further embodiments, the wiring monitor 132 can be configured to transmit the determined status to the controller 116. In certain embodiments, the wiring monitor can be a Raspberry Pi® and Arduino®. In additional embodiments, transmissions between the wiring monitor 132 and the controller 116 can be performed through Ethernet and the MODBUS TCP protocol. The power supply 212 can be configured to provide electrical power for operation of the marshalling system 110 (e.g., the wiring monitor 132).

Figure 3A:
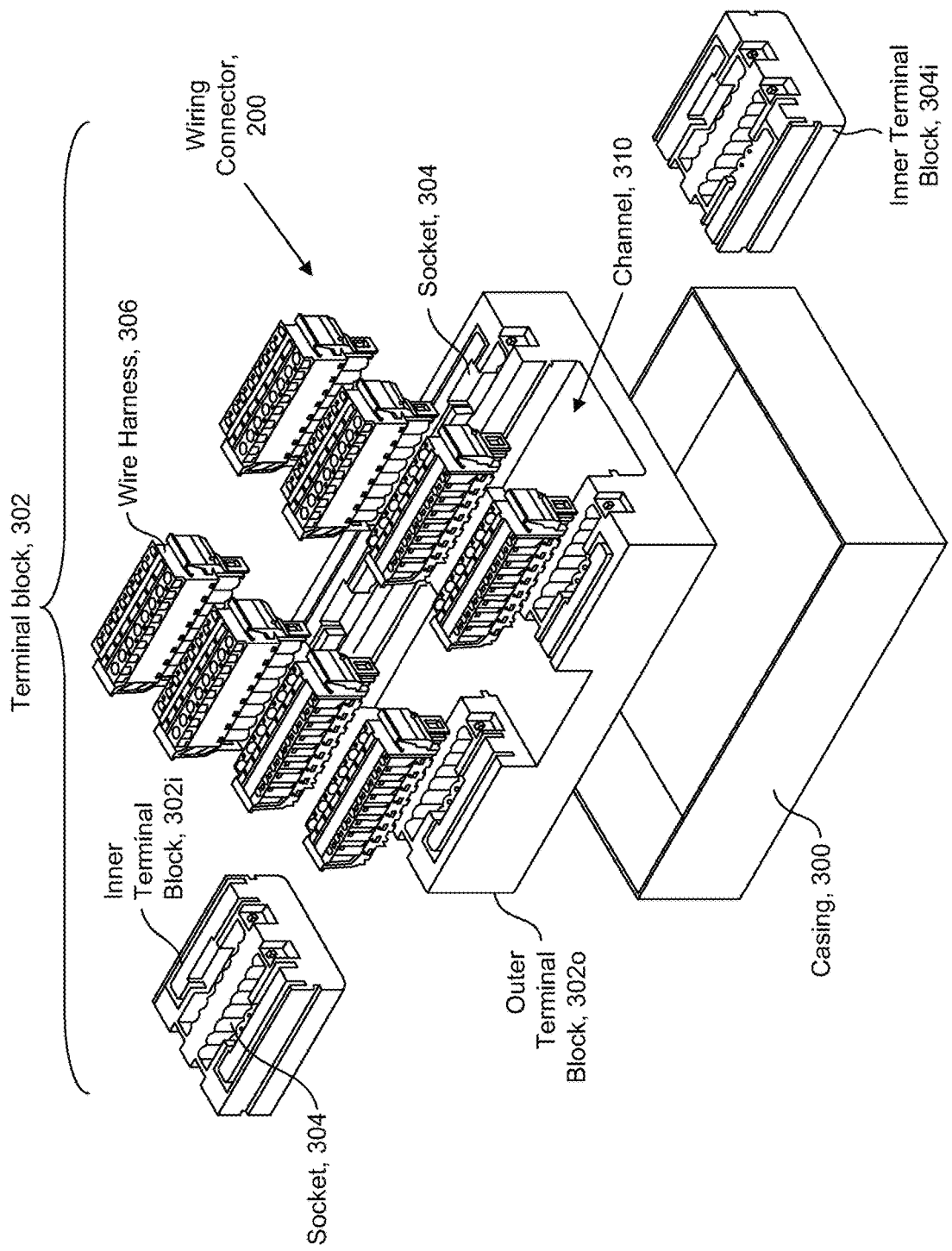
FIG. 3A is a diagram illustrating an isometric, exploded view of one exemplary embodiment of a wiring connector of the wiring assembly of FIGS. 2A-2B including a plurality of terminal blocks.
Figure 3B:
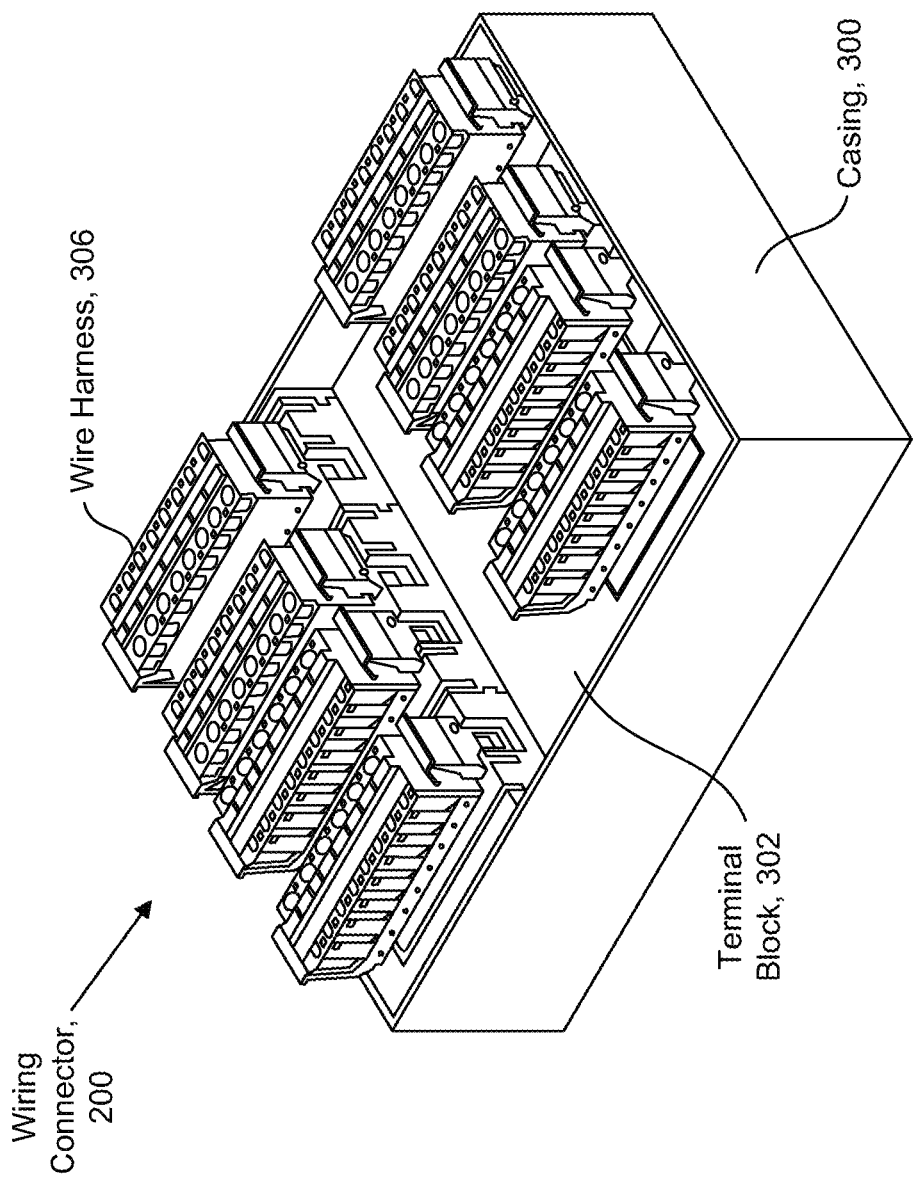
FIG. 3B is a diagram illustrating an isometric, assembled view of the wiring connector of FIGS. 2A-2B.

FIGS. 3A-3B are schematic diagrams illustrating one exemplary embodiment of the wiring connector 200 in exploded view (FIG. 3A) and an assembled view (FIG. 3B). As shown, the wiring connector 200 includes a casing 300, at least one terminal block 302 including one or more sockets 304 and one or more wire harnesses 306 (e.g., terminal block headers) corresponding to at least a respective ones of the sockets 304. It can be understood that the number of wire harnesses 306, the number of inner terminal blocks 302i, and the number of sockets 304 can be independently varied as necessary.

The casing 300 is dimensioned to receive the terminal block 302. In one embodiment, a terminal block 302 can be configured with an outer terminal blocks 302o and one or more inner terminal blocks 302i. As shown, the terminal block 302 includes an outer terminal block 302o with a channel 310 and two inner terminal blocks 302i are dimensioned for receipt within the channel 310 of the outer terminal block 302o. However, while illustrated as separate components, in alternative embodiments, the inner and outer terminal blocks can be formed as a single structure.

As noted above, each of the sockets 304 is configured for receipt of a corresponding wire harness 306. Each wire harness 306 includes one or more wire harness pins 306p configured for electrical connection with respective field wiring 112 or factory wiring 124. Each socket 304 of the terminal block 302 includes one or more terminal block pins 302p configured to receive a respective wire harness 306 for electrical connection respective wire harness pins 306. The terminal block pins 306p of pairs of terminal blocks 302 are further connected by a wiring bridge 308. Each pair of bridged terminal blocks 302 includes one or more first sockets 304 having terminal block pins 304p in communication with the field wiring 112 and one or more second sockets 304 having terminal block pins 304p in communication with the field wiring 124. In this manner, the field wiring 112 and the factory wiring are connected when the wire harnesses 306 are inserted in their respective sockets 304. The relative placement of terminal blocks 302 having terminal block pins 304p in communication with the field wiring 112 and sockets 304 having terminal block pins 304p in communication with the field wiring 124 can be varied within the wiring connector 200. In one embodiment, all of the terminal blocks 302 having terminal block pins 304p in communication with the field wiring 112 can be positioned on one side of the wiring connector 200 (e.g., the left side) and all of the terminal blocks 302 having terminal block pins 304p in communication with the factory wiring 124 can be positioned on an opposite side of the wiring connector 200 (e.g., the right side). A benefit of this configuration is to reduce confusion when connecting wire harnesses 306 to corresponding sockets 304.

Figure 3C:
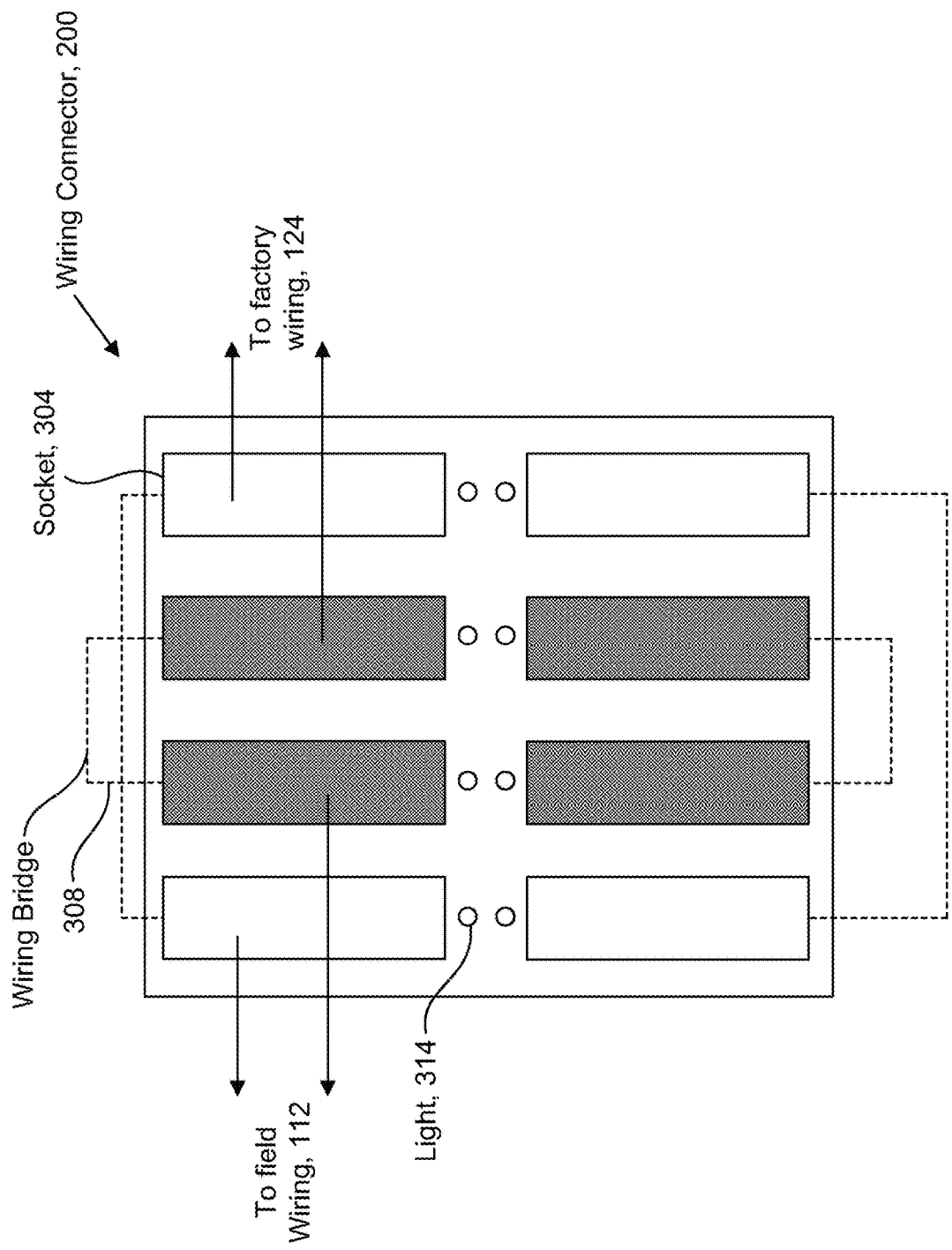
FIG. 3C is a schematic block diagram illustrating one exemplary embodiment of the wiring connector of FIGS. 3A-3B including bridging wiring.

As an example, assume each wiring connector 200 includes eight sockets 304 arranged in two rows of four, as shown in FIGS. 3C and 4A-4B. The pair of bridged sockets 304 include inner terminal blocks 302i bridged by wiring and the sockets 304 of the pair of outer terminal blocks 302o bridged by wiring. Each socket 304 further includes eight terminal block pins 302p and each wire harness 306 includes eight wire harness pins 306p. That is, each pair of sockets 304 can form eight input/output (I/O) connections. Thus, the wiring connector 200 illustrated in FIG. 3C, can support up to 32 I/O connections (eight connections/terminal socket pair*four terminal socket pairs). These I/O connections are formed when the corresponding wire harness 306 is inserted within its corresponding socket 304, providing tool-less I/O connections.

Use of inner terminal blocks 302i and outer terminal blocks 302o provides further benefits. In one aspect, more connections can be provided on a single terminal block 302 without crossing field wiring 112 and factory wiring 124. In another aspect, manufacturing is made easier. It is possible to employ just one pair of terminal blocks, rather than multiple pairs (e.g., four pairs, as discussed above). However, there are tradeoffs between use of greater or fewer terminal blocks. One terminal block means there are fewer connections to be plugged in. However, if maintenance is required, more wires are disconnected at the same time.

An additional benefit of the above-discussed marshalling system 110 is facilitating connection of field wiring 112 to factory wiring 124 more rapidly than conventional marshalling cabinets. As an example, prior to arrival of the marshalling system 110 at a customer site, the time consuming task of terminating field wiring 112 and the factory wiring 124 (e.g., on respective wire harnesses 306) can be completed. Thus, when the marshalling system 110 is installed onsite, the field wiring 112 and the factory wiring can be quickly connected when the wire harnesses 306 are inserted in their respective sockets 304. In contrast, when employing conventional marshalling cabinets, such marshalling cabinets must be installed on site prior to termination of field wiring 112 and factory wiring 124.

The marshalling system 110 can be configured to determine the connection status of each of the sockets 304 of the wiring connector(s) 200. As an example, each wiring connector 200 can include a switch in electrical communication with the power supply 212. In general, the switch can be closed when the wire harness 306 is inserted within its corresponding socket 304 by a predetermined amount. The predetermined amount of insertion can be an distance sufficient to place the wire harness pins 306p in electrical communication with the terminal block pins 302p. Similarly, the switch can be open when the wire harness 306 is not inserted within its corresponding socket 304 by the predetermined amount (e.g., the wire harness pins 306p in not in electrical communication with the terminal block pins 302p).

In an embodiment, the switch can be a magnetic switch that includes a first portion 312a (e.g., a reed switch) positioned within the terminal block 302 and a second portion 312b (e.g., a magnetic actuator) positioned within the wire harness 306. It can be understood that, in alternative embodiments, the switch can adopt other forms as necessary.

In use, when a wire harness 306 is inserted within a corresponding socket 304, the switch can be closed and a "high" voltage signal (e.g., 5V) can be output as a socket connection signal to the wiring monitor 132. Receipt of the socket connection signal by the wiring monitor 132 can be used to determine a "connected" connection status of each socket 304.

The switch can operate in a variety of configurations to facilitate determination of a "disconnected" status of a socket 304. In a first configuration, when a wire harness 306 is not inserted within a corresponding socket 304 by the predetermined amount, the switch can be open and no socket connection signal is transmitted to the wiring monitor 132. Lack of receipt of the socket connection signal by the wiring monitor 132 can be used to determine the "disconnected" connection status of a socket 304.

It can be appreciated that, in this first configuration, if no power is available from the power supply 212, then all sockets 304 would detected as "disconnected," regardless of their actual status. Accordingly, in an alternative embodiment, the switch can operate in a second configuration when the switch is open and output a "low" voltage signal (e.g., 1-2V) as a socket disconnected signal to the wiring monitor 132. In this configuration, receipt of the socket disconnected signal by the wiring monitor 132 can be used to determine a "disconnected" status of the corresponding sockets 304.

It can be understood that, in certain embodiments, each socket can be monitored in this manner. In alternative embodiments, selected sockets can be monitored in this manner.

Optionally, the wiring connector 200 can include a light (e.g., an LED) for each the terminal socket (e.g., mounted to the terminal block 302) in communication with the switch and/or the wiring monitor 132. The light can be configured to adopt a first illumination state (e.g., on) when the connection status of the wiring connector is determined to be connected. The light and adopt a second illumination state, different from the first illumination state (e.g., off), when the connection status of the wiring connector is determined to be disconnected. As an example, the light can receive the connected signal directly from the switch or another signal from the The connected signal can be transmitted to the light directly from the switch That is, the configured lit in response to transmission of the connection signal. The light corresponding to the terminal socket can remain unlit.

Alternatively or additionally, the marshalling system 110 (e.g., the wiring monitor 132) can be configured to determine a connection status of terminal block pins 302p. Terminal block pins 302p monitored in this manner can be in electrical communication with a high impedance circuit 314 and the power source 212. The high impedance circuit 314 can be configured to monitor individual wire connections within a wire harness 306 and verify that there is continuity between the field wiring 112 and the factory wiring 124 once the wire harness 306 is inserted within its corresponding socket 304. As an example, the high impedance circuit 314 can be configured to output a current (e.g., a pin connection signal) at a predetermined level to the wiring monitor 132 when the terminal block pin 302p is in electrical communication with a corresponding wire harness pin 306p.

In this manner, the wiring monitor 132 can determine that a given terminal block pin 302p is connected by receipt of the pin connection signal. Conversely, the wiring monitor 132 can determine that a given terminal block pin 302p is disconnected absent receipt of the pin connection signal. This configuration can be beneficial as it does not require any signal and/or power to be received from the controller 116 and instead relies solely on power received from the power supply 212. In this manner, the connection status of each terminal block pin 302p can be assessed in the absence of signal or power from the controller 116.

It can be understood that, in certain embodiments, each terminal block pin can be monitored in this manner. In alternative embodiments, selected terminal block pins can be monitored in this manner.

As discussed in greater detail below, the connection status of a given socket 304 and/or terminal block pin 302p can be designated as disabled. This status may be designated when a socket 304 or terminal block pin 302p is deliberately removed from service. Beneficially, this status allows distinction between "disconnected" status that is intended versus unintended.

The connection status of each socket 304 and/or terminal block pin 302p (e.g., connected, disconnected, disabled) determined by the wiring monitor 132 can be stored locally by the wiring monitor 132 and/or transmitted by the wiring monitor 132 to the controller 116. Such transmissions can be performed continuously, periodically at defined time intervals and/or in response to request from the controller 116. In response to receipt of the connection status information from the wiring monitor 132, the controller 116 can store the connection status in the historian 120 as a function of time for later retrieval.

Figure 5:
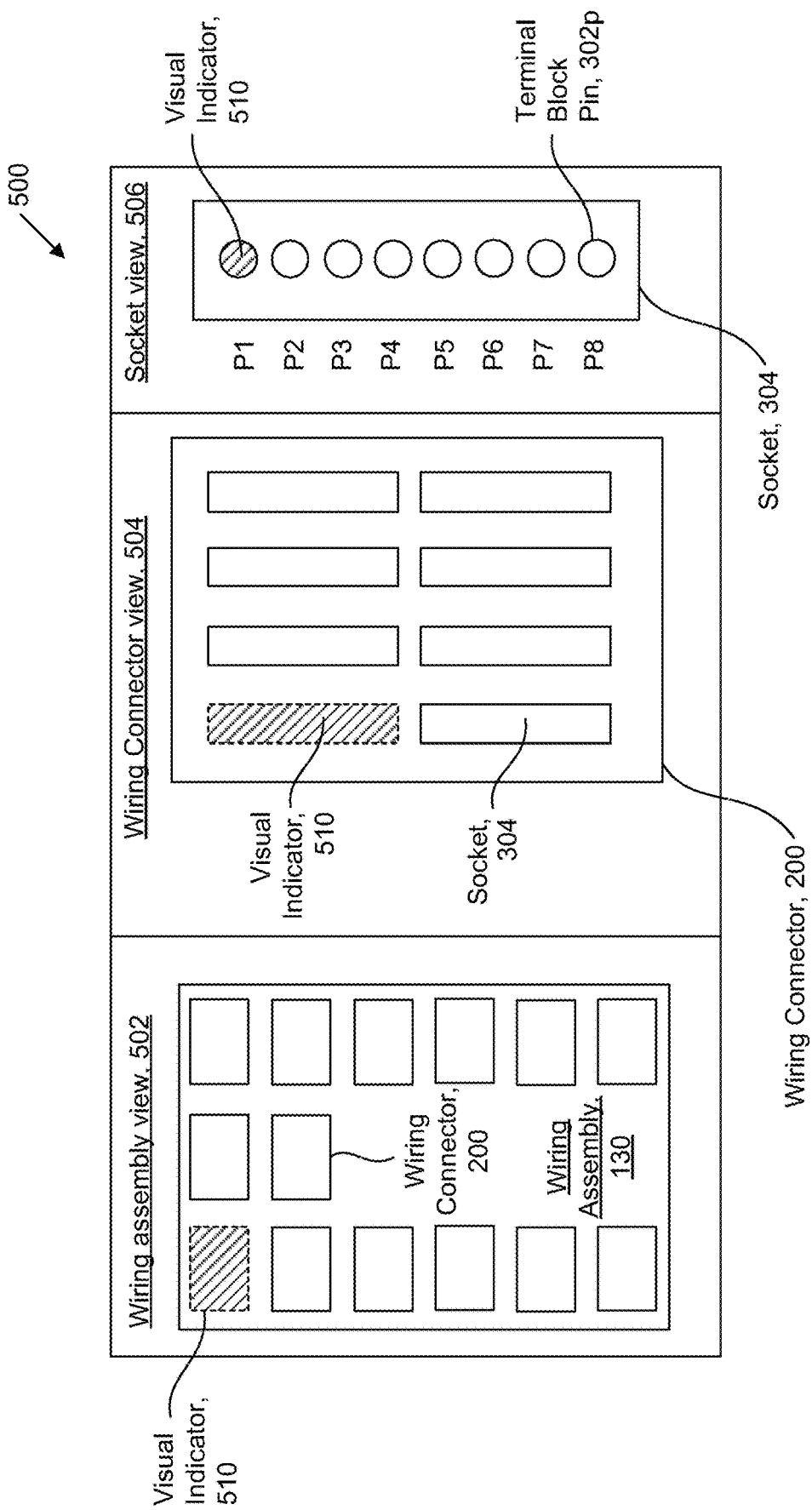
FIG. 5 is a schematic diagram illustrating one embodiment of a graphical user interface displaying connection statuses of wiring harnesses and wiring harness pins.

Graphical user interfaces illustrating the connection status of sockets 304 and/or terminal block pins 302p can also be generated in response to requests from the user computing device 122. Such graphical user interfaces can be generated by the wiring monitor 132 and/or the controller 116. One exemplary graphical user interface (GUI) 500 is illustrated in FIG. 5. As shown, the GUI 500 can include a wiring assembly view 502, a wiring connector view 504, and a socket view 506. The wiring assembly view 502 can illustrate the wiring assembly 130 with selectable wiring connectors 200 (WC). The wiring connector view 504 can be displayed in response to selection of a wiring connector 200 from the wiring assembly view 502 and illustrates the sockets 304 of the selected wiring connector 200. The socket view 506 can be displayed in response to selection of a socket 304 from the wiring connector view 504 and illustrates the terminal block pins 302p of the selected socket 304. In certain embodiments, the wiring assembly 130, wiring connections 200, sockets 304, and terminal block pins 302p can be displayed in a layout that corresponds to their physical arrangement.

Each of the wiring connectors 200, sockets 304, and terminal block pins 302p can be independently represented in a predetermined color and/or other visual indicator 510 (e.g., outline, pattern, shape, etc.) corresponding to the socket and pin connection statuses determined by the wiring monitor 132. In one aspect, a first color can be displayed when a socket 304 and/or terminal block pin 302p is determined to have the "connected" status by the wiring monitor 132. In another aspect, a second color can be displayed when the socket 304 and/or terminal block pin 302p is determined to have the "disconnected" status by the wiring monitor 132. In a further aspect, a third color can be displayed when a socket 304 and/or terminal block pin 302p is designed as disabled. In certain embodiments, different colors can be employed for representing different pairs of sockets 304 (e.g., blue for a first pair and red for a second pair).

In further embodiments the graphical user interface 500 can be configured to display other visual indicators to facilitate recognition of one or more predetermined characteristics of the sockets 304 and/or terminal block pins 302p. In another embodiment, representation can be displayed in a list grouped by the type of signal transmitted (e.g., analog, digital, type of sensor, type of PLC, marshalling cabinet, etc.)

Figure 6:
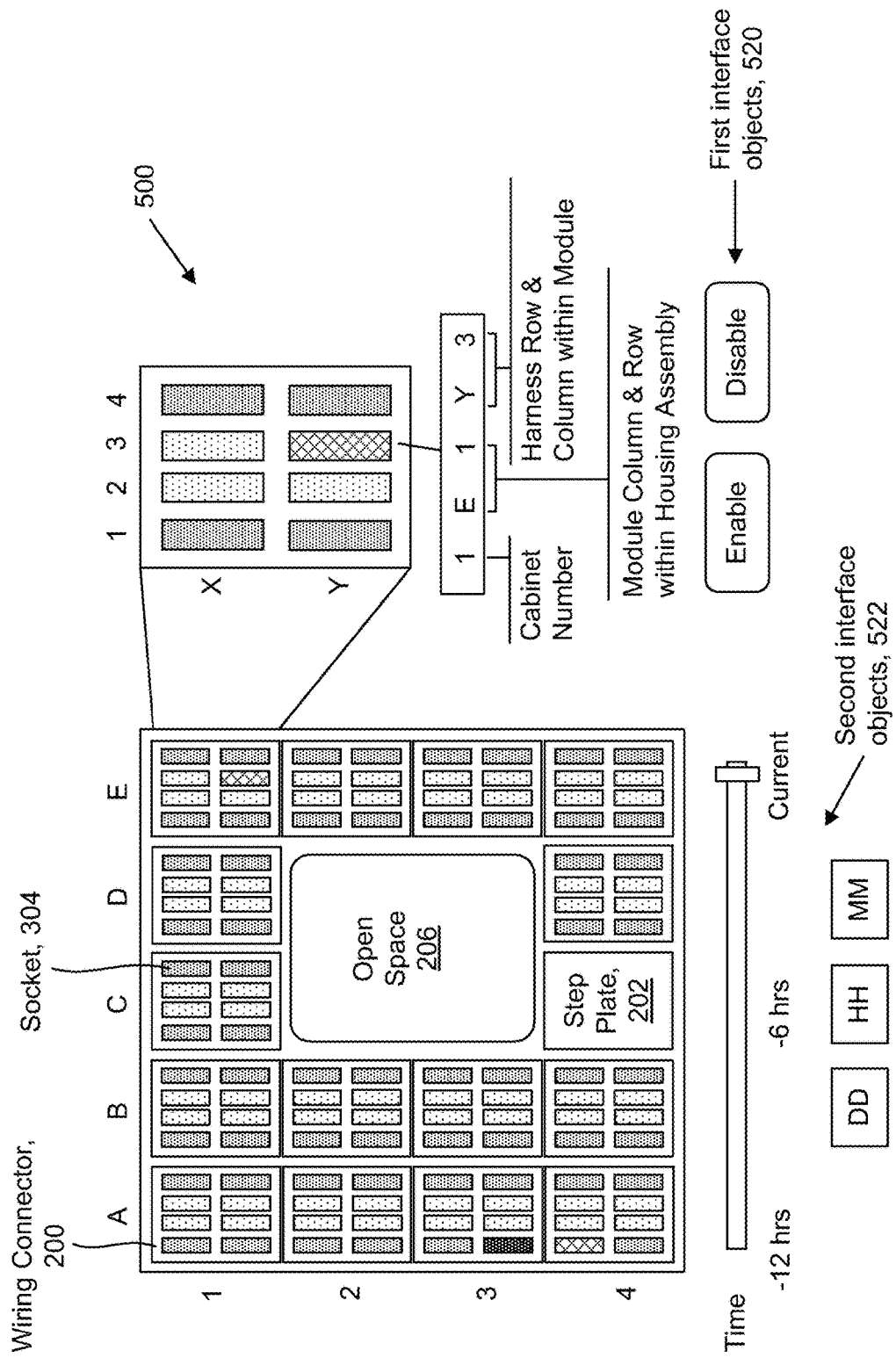
FIG. 6 is a schematic diagram illustrating another embodiment of the graphical user interface displaying connection status of wiring coupled to the wiring assembly.

In alternative embodiments, two or more of the wiring assembly view 502, wiring connector view 504, and socket view 506 can be combined. As illustrated in FIG. 6, the wiring assembly view 502 and the wiring connector view 504 can be combined, allowing selection of a socket 304 directly from the wiring assembly view 502 and subsequent display of the socket view 506. As a further example (not shown), the wiring connector view 504 and the socket view 506 can be combined, allowing display of the status of respective terminal block pins 302 from the wiring connector view 504 (FIG. 6, inset, right). In additional embodiments (not shown), the wiring assembly view 502, the wiring connector view 504, and the socket view 506 can be combined, allowing display of socket connection status and pin connection status within the wiring assembly view.

The graphical user interface 500 can further display a unique identifier for each socket 304. Each marshalling cabinet 126 can be assigned a cabinet number (e.g., 1-n). Each wiring connector 200 can be further identified by an identifier specifying row and column within the wiring assembly 130. As shown, the columns of wiring connectors 200 within the wiring assembly 130 are designated A-E and the rows the wiring connectors 200 within the wiring assembly 130 are designated 1-4. Each row and column of the sockets 304 within a wiring connector can further include an identifier. As shown, the columns of wiring connectors 200 are designated 1-4 and the rows of wiring connectors 200 are designated X, Y. Thus, an exemplary identifier of a socket illustrated in FIG. 6 (inset, right) possesses the identifier 1E1Y3 and a visual indicator corresponding to a "connected" status.

As discussed above, selected wiring connectors 200, sockets 304, and terminal block pins 302p can be deliberately designated at "disabled." Disabled status can be appropriate under any circumstances where wiring connectors 200, sockets 304, or terminal block pins 302p it is desired that connection status is not monitored. Examples can include terminal block pins 302p intended for connection of field wiring 112 and/or factory wiring 124 that is decommissioned, during maintenance or reconfiguration of the system 100, etc.

In further embodiments, the graphical user interface 500 can be configured to permit the user to designate a given socket 304 and/or terminal block pin 304p as enabled or disabled. As an example, the user can select a socket 304 and/or terminal block pin 302p and subsequently select a first user interface object 520 to designate such status ("Enable" button or "Disable" button).

The graphical user interface 500 can also include one or more second user interface objects 522 that allow display of the connection status of the sockets 304 and/or terminal block pins 304p at a specific time, including the current time, periodically refreshed with real-time updates. Examples of such second user interface objects 522 can include dialog boxes configured for entry of specific dates and times. Alternatively or additionally, other second user interface objects 522 such as sliders can be provided.

The wiring monitor 132 and/or the controller 116 can also be configured to annunciate an alarm based upon the determined connection status of the sockets 304 and/or the terminal block pins 302p. As an example, a user can specify alarm conditions independently for each socket 304 and/or each terminal block pin 302p. Such conditions can include a type of status (e.g., disconnected), alone or in combination with other criteria (e.g., specific time window, time duration, etc.). When conditions are satisfied, the wiring monitor 132 and/or controller 116 can output a signal operative to trigger annunciation of an alarm (e.g., audible and/or visual alarms). The alarm can be annunciated by the user computing device, and/or other predetermined devices. As an example, the alarm can be presented within the graphical user interface (e.g., change of color, flashing text, etc.) In this manner, undesired connection states within the wiring assembly 130 can be quickly identified and remedied.

Figure 7:
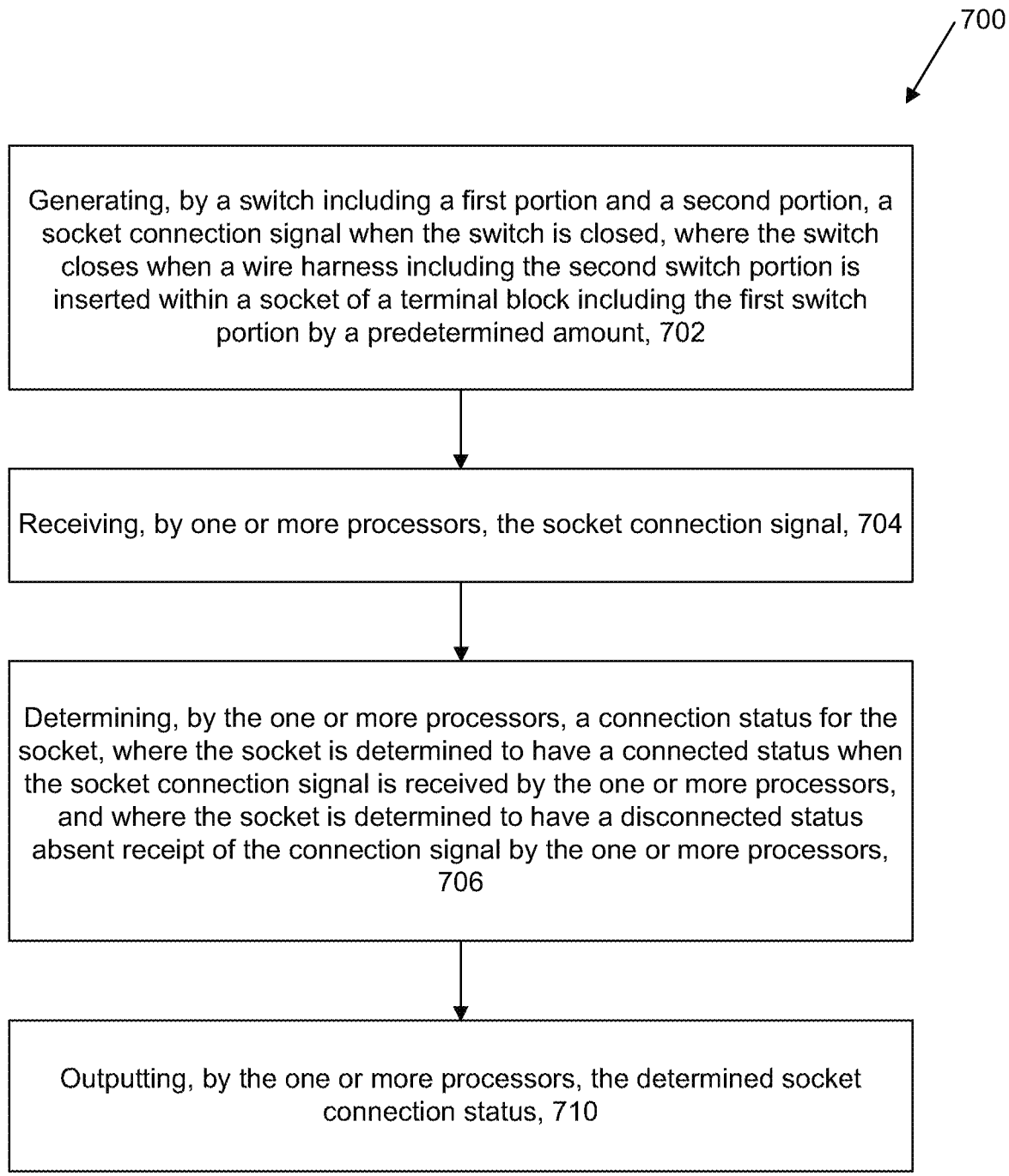
FIG. 7 is a flow diagram illustrating one exemplary embodiment of a method of monitoring connection status of wiring coupled to the marshalling system of FIG. 1.

FIG. 7 is a flow diagram illustrating one exemplary embodiment of a method 700 of monitoring wiring within the marshalling system 110. The method 700 includes operations 702-710 and is discussed in the context of the embodiments of FIGS. 1-6. It can be understood that, in alternative embodiments, the method 700 can include greater or fewer operations than illustrated in FIG. 7 and these operations can be performed in an order different from that illustrated in FIG. 7.

In operation 702, the switch generates the socket connection signal when closed. As discussed above, the switch includes the first switch portion 312a is positioned within the terminal block 302 and the second switch portion 312b is positioned within the wire harness 306. The switch closes when the wire harness 306 is inserted within the socket 304 of the terminal block 302 by the predetermined amount.

In operation 704, the socket connection signal is received by one or more processors (e.g., the wiring monitor 132).

In operation 706, the one or more processors (e.g., the wiring monitor 132) can determine a connection status for the socket 304. The socket 304 can be determined to have a connected status when the socket connection signal is received by the wiring monitor 132. The socket 304 can be determined to have a disconnected status absent receipt of the connection signal by the wiring monitor.

In operation 710, the wiring monitor 132 can output the determined socket connection status and/or the determined pin connection status. As an example, the determined socket and/or pin connection status can be output to the controller 116 and/or the historian 120. The graphical user interface 500 can be generated based upon the determined socket and/or pin connection status.

Exemplary technical effects of the methods, systems, and devices described herein include, by way of non-limiting example, remote monitoring of the wiring status of marshalling cabinets, storage of the wiring status, and display of the wiring status on demand. Remote monitoring can allow operators to save time during troubleshooting, configure alarms for improper state of connection, and cross-reference historical data for post-mortem analysis. Furthermore, this information can reduce installation cost and cycle by allowing a tiered installation procedure, which can give flexibility to the marshalling cabinet installation logistics.

Certain exemplary embodiments have been described to provide an overall understanding of the principles of the structure, function, manufacture, and use of the systems, devices, and methods disclosed herein. One or more examples of these embodiments have been illustrated in the accompanying drawings. Those skilled in the art will understand that the systems, devices, and methods specifically described herein and illustrated in the accompanying drawings are non-limiting exemplary embodiments and that the scope of the present invention is defined solely by the claims. The features illustrated or described in connection with one exemplary embodiment may be combined with the features of other embodiments. Such modifications and variations are intended to be included within the scope of the present invention. Further, in the present disclosure, like-named components of the embodiments generally have similar features, and thus within a particular embodiment each feature of each like-named component is not necessarily fully elaborated upon.

The subject matter described herein can be implemented in analog electronic circuitry, digital electronic circuitry, and/or in computer software, firmware, or hardware, including the structural means disclosed in this specification and structural equivalents thereof, or in combinations of them.

The subject matter described herein can be implemented as one or more computer program products, such as one or more computer programs tangibly embodied in an information carrier (e.g., in a machine-readable storage device), or embodied in a propagated signal, for execution by, or to control the operation of, data processing apparatus (e.g., a programmable processor, a computer, or multiple computers). A computer program (also known as a program, software, software application, or code) can be written in any form of programming language, including compiled or interpreted languages, and it can be deployed in any form, including as a stand-alone program or as a module, component, subroutine, or other unit suitable for use in a computing environment. A computer program does not necessarily correspond to a file. A program can be stored in a portion of a file that holds other programs or data, in a single file dedicated to the program in question, or in multiple coordinated files (e.g., files that store one or more modules, sub-programs, or portions of code). A computer program can be deployed to be executed on one computer or on multiple computers at one site or distributed across multiple sites and interconnected by a communication network.

The processes and logic flows described in this specification, including the method steps of the subject matter described herein, can be performed by one or more programmable processors executing one or more computer programs to perform functions of the subject matter described herein by operating on input data and generating output. The processes and logic flows can also be performed by, and apparatus of the subject matter described herein can be implemented as, special purpose logic circuitry, e.g., an FPGA (field programmable gate array) or an ASIC (application-specific integrated circuit).

Processors suitable for the execution of a computer program include, by way of example, both general and special purpose microprocessors, and any one or more processor of any kind of digital computer. Generally, a processor will receive instructions and data from a read-only memory or a random access memory or both. The essential elements of a computer are a processor for executing instructions and one or more memory devices for storing instructions and data. Generally, a computer will also include, or be operatively coupled to receive data from or transfer data to, or both, one or more mass storage devices for storing data, e.g., magnetic, magneto-optical disks, or optical disks. Information carriers suitable for embodying computer program instructions and data include all forms of non-volatile memory, including by way of example semiconductor memory devices, (e.g., EPROM, EEPROM, and flash memory devices); magnetic disks, (e.g., internal hard disks or removable disks); magneto-optical disks; and optical disks (e.g., CD and DVD disks). The processor and the memory can be supplemented by, or incorporated in, special purpose logic circuitry.

To provide for interaction with a user, the subject matter described herein can be implemented on a computer having a display device, e.g., a CRT (cathode ray tube) or LCD (liquid crystal display) monitor, for displaying information to the user and a keyboard and a pointing device, (e.g., a mouse or a trackball), by which the user can provide input to the computer. Other kinds of devices can be used to provide for interaction with a user as well. For example, feedback provided to the user can be any form of sensory feedback, (e.g., visual feedback, auditory feedback, or tactile feedback), and input from the user can be received in any form, including acoustic, speech, or tactile input.

The techniques described herein can be implemented using one or more modules. As used herein, the term "module" refers to computing software, firmware, hardware, and/or various combinations thereof. At a minimum, however, modules are not to be interpreted as software that is not implemented on hardware, firmware, or recorded on a non-transitory processor readable recordable storage medium (i.e., modules are not software per se). Indeed "module" is to be interpreted to always include at least some physical, non-transitory hardware such as a part of a processor or computer. Two different modules can share the same physical hardware (e.g., two different modules can use the same processor and network interface). The modules described herein can be combined, integrated, separated, and/or duplicated to support various applications. Also, a function described herein as being performed at a particular module can be performed at one or more other modules and/or by one or more other devices instead of or in addition to the function performed at the particular module. Further, the modules can be implemented across multiple devices and/or other components local or remote to one another. Additionally, the modules can be moved from one device and added to another device, and/or can be included in both devices.

The subject matter described herein can be implemented in a computing system that includes a back-end component (e.g., a data server), a middleware component (e.g., an application server), or a front-end component (e.g., a client computer having a graphical user interface or a web browser through which a user can interact with an implementation of the subject matter described herein), or any combination of such back-end, middleware, and front-end components. The components of the system can be interconnected by any form or medium of digital data communication, e.g., a communication network. Examples of communication networks include a local area network ("LAN") and a wide area network ("WAN"), e.g., the Internet.

Approximating language, as used herein throughout the specification and claims, may be applied to modify any quantitative representation that could permissibly vary without resulting in a change in the basic function to which it is related. Accordingly, a value modified by a term or terms, such as "about," "approximately," and "substantially," are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise.

One skilled in the art will appreciate further features and advantages of the invention based on the above-described embodiments. Accordingly, the present application is not to be limited by what has been particularly shown and described, except as indicated by the appended claims. All publications and references cited herein are expressly incorporated by reference in their entirety.

The invention claimed is:
1. A marshalling system, comprising:
a wiring assembly including at least one wiring connector mounted to a base, each wiring connector being in electrical communication with a power supply and including, a terminal block including a socket and one or more terminal block pins configured for electrical communication with field wiring of an industrial control system;

a wire harness dimensioned for receipt within the socket and including one or more wire harness pins configured for electrical communication with factory wiring of the industrial control system; and a switch including a first portion positioned within the terminal block and a second portion positioned within the wire harness, wherein the switch is configured to close when the wire harness is inserted with the socket by a predetermined amount, and wherein the switch outputs a socket connection signal when closed that represents the socket having a connected status; and at least one processor configured to:
receive the socket connection signal;
determine a connection status for the socket, wherein the socket is determined to have the connected status when receiving the socket connection signal, and wherein a socket is determined to have a disconnected status absent receipt of the connection signal; and
output the determined socket connection status.

2. The system of claim 1, further comprising a high-impedance circuit in electrical communication with a terminal block pin of the socket, the power supply, and the at least one processor, wherein each high-impedance circuit is configured to output a pin connection signal at a predetermined level to the at least one processor when the terminal block pin is in electrical communication with a corresponding wire harness pin.

3. The system of claim 2, wherein the at least one processor is further configured to:
determine a pin connection status of the terminal block pin with the corresponding wire harness pin, wherein the pin connection status is determined to be a connected status when the at least one processor receives the pin connection signal, and wherein the pin connection status is determined to be a disconnected status absent receipt of the pin connection signal by the at least one processor; and
output the determined pin connection status.

4. The system of claim 1, wherein the at least one processor is further configured to trigger an alarm when the socket connection status changes from the connected status to the disconnected status.

5. The system of claim 1, wherein the switch is a magnetic switch, the first portion of the magnetic switch is a reed switch, and the second portion of the magnetic switch is a magnetic actuator.

6. The system of claim 1, wherein:
the switch is further configured to open when the wire harness is not inserted within its corresponding socket by the predetermined amount, and to output a socket disconnection signal when open; and
the at least one processor is configured to receive the disconnection signal and to determine that a socket has the disconnected status by receipt of the socket disconnection signal for that wiring connection.

7. The system of claim 1, wherein the wiring assembly further comprises a light configured to adopt a first illumination state when the connection status of the socket is determined to be the connected status and adopt a second illumination state, different from the first illumination state, when the connection status of the socket is not the connected status.

8. A method, comprising:
generating, by a switch including a first portion and a second portion, a socket connection signal when the switch is closed, wherein the switch is configured to close when a wire harness including the second switch portion is inserted within a socket of a terminal block including the first switch portion by a predetermined amount, wherein the wire harness includes more wire harness pins in communication with factory wiring of an industrial control system, and wherein the terminal block includes one or more terminal block pins in communication with field wiring of the industrial control system;
receiving, by one or more processors, the socket connection signal;
determining, by the one or more processors, a connection status for the socket, wherein the socket is determined to have a connected status when the socket connection signal is received by the one or more processors, and wherein the socket is determined to have a disconnected status absent receipt of the connection signal by the one or more processors; and
outputting, by the one or more processors, the determined socket connection status.

9. The method of claim 8, further comprising triggering, by the one or more processors, an alarm when the socket connection status changes from the connected status to the disconnected status.

10. The method of claim 8, further comprising:
outputting, by a high impedance circuit in communication with a terminal block pin, a pin connection signal when the terminal block pin is in electrical communication with a corresponding wire harness pin;
determining, by the at least one processor, a pin connection status of the terminal block pin with the corresponding wire harness pin, wherein the pin connection status is determined to be a connected status when the at least one processor receives the pin connection signal, and wherein the pin connection status is determined to be a disconnected status absent receipt of the pin connection signal by the at least one processor; and
outputting, by the at least one processor, the determined pin connection status.

11. The method of claim 10, further comprising triggering, by the one or more processors, an alarm when the pin connection status changes from the connected status to the disconnected status.

12. The method of claim 8, wherein the switch is further configured to open when the wire harness is not inserted within its corresponding socket by the predetermined amount, and wherein the method further comprises:
outputting, by the switch, a socket disconnection signal when open;
receiving, by the at least one processor, the socket disconnection signal; and
determining, by the at least one processors, the socket status connection to be a disconnected status by receipt of the socket disconnection signal.

13. The method of claim 8, further comprising:
adopting, by a light coupled to the terminal block, a first illumination state after the connection status of the socket is determined to be the connected status; and adopting, by the light, a second illumination state, different from the first illumination state, when the connection status of the socket is not the connected status.

14. The method of claim 10, further comprising, by the one or more processors, generating a graphical user interface including at least one visual indicator representing the determined socket connection status or the determined pin connection status.

15. The method of claim 14, wherein the graphical user interface further comprises a representation of at least one of the terminal blocks or terminal block pins arranged in a layout corresponding to a physical layout of the plurality of terminal blocks or terminal block pin, and wherein the at least one visual indicator is associated with its corresponding terminal block or terminal pin.

16. The method of claim 14, wherein the graphical user interface further comprises a first user interface object that, when selected, is operative to disable determination of connection status for at least one of a selected socket or a selected terminal block pin by the at least one processor.

* * * * *